United States Patent
Yen

(10) Patent No.: US 11,811,164 B2
(45) Date of Patent: Nov. 7, 2023

(54) ELECTRICAL CONNECTOR AND MANUFACTURING METHOD FOR THE SAME

(71) Applicant: CHANT SINCERE CO., LTD., New Taipei (TW)

(72) Inventor: Ming-Hui Yen, New Taipei (TW)

(73) Assignee: CHANT SINCERE CO., LTD., New Taipei (TW)

( * ) Notice: Subject to any disclaimer, the term of this patent is extended or adjusted under 35 U.S.C. 154(b) by 37 days.

(21) Appl. No.: 17/482,441

(22) Filed: Sep. 23, 2021

(65) Prior Publication Data

US 2023/0046433 A1    Feb. 16, 2023

(30) Foreign Application Priority Data

Aug. 13, 2021  (TW) ................. 110130021

(51) Int. Cl.
*H01R 24/60* (2011.01)
*H01R 13/52* (2006.01)
*H01R 12/71* (2011.01)
*H01R 13/502* (2006.01)
(Continued)

(52) U.S. Cl.
CPC ......... *H01R 13/521* (2013.01); *H01R 12/716* (2013.01); *H01R 13/502* (2013.01); *H01R 24/60* (2013.01); *H01R 43/005* (2013.01); *H01R 43/0256* (2013.01)

(58) Field of Classification Search
CPC .. H01R 13/521; H01R 12/716; H01R 13/502; H01R 24/60; H01R 43/005; H01R 43/0256; H01R 13/6658; H01R 13/5045; H01R 13/5219; H01R 12/57;
(Continued)

(56) References Cited

U.S. PATENT DOCUMENTS

| 7,922,535 | B1 * | 4/2011 | Jiang ................. H01R 13/5205 439/271 |
| 9,843,148 | B2 * | 12/2017 | Little ..................... H01R 24/60 |
| 9,905,944 | B2 * | 2/2018 | Little ............... H01R 13/65918 |

(Continued)

FOREIGN PATENT DOCUMENTS

| KR | 102210023 B1 | 2/2021 |
| TW | 201719981 A | 6/2017 |

(Continued)

*Primary Examiner* — Abdullah A Riyami
*Assistant Examiner* — Nelson R. Burgos-Guntin

(57) ABSTRACT

An electrical connector and a manufacturing method for the same. The electrical connector comprises a housing member and a plugging module. One end of the housing member is provided with a mating interface. An accommodating space communicating with the mating interface is provided in the housing member. The plugging module comprises a first circuit board, a plurality of electrical conductors and a plurality of first soldering pads. The first circuit board is disposed in the accommodating space. The first circuit board comprises a first surface and a second surface opposite to the first surface. The plurality of electrical conductors are disposed on the first surface and/or the second surface and is close to the mating interface. The plurality of first soldering pads are disposed on the second surface and are electrically connected with the plurality of electrical conductors.

15 Claims, 13 Drawing Sheets

(51) Int. Cl.
 *H01R 43/00* (2006.01)
 *H01R 43/02* (2006.01)

(58) Field of Classification Search
 CPC ... H05K 2201/09154; H05K 2201/094; H05K 2201/09409; H05K 1/117
 See application file for complete search history.

(56) References Cited

U.S. PATENT DOCUMENTS

| | | | | |
|---|---|---|---|---|
| 10,355,394 | B2* | 7/2019 | Zhang | H01R 13/6581 |
| 10,468,825 | B2* | 11/2019 | Zhao | H01R 13/504 |
| 2015/0171573 | A1* | 6/2015 | Little | H01R 12/724 |
| | | | | 439/607.34 |
| 2015/0171574 | A1* | 6/2015 | Little | H01R 13/6658 |
| | | | | 439/78 |
| 2015/0194772 | A1* | 7/2015 | Little | H01R 13/6597 |
| | | | | 439/607.34 |
| 2015/0200504 | A1* | 7/2015 | Little | H01R 24/60 |
| | | | | 439/345 |
| 2015/0207280 | A1* | 7/2015 | Little | H01R 13/6591 |
| | | | | 439/607.34 |
| 2015/0255905 | A1* | 9/2015 | Little | H01R 13/6658 |
| | | | | 439/78 |
| 2015/0318646 | A1* | 11/2015 | Little | H01R 24/60 |
| | | | | 439/78 |
| 2016/0064868 | A1* | 3/2016 | Little | H01R 13/748 |
| | | | | 439/676 |
| 2016/0268700 | A1* | 9/2016 | Little | H01R 12/53 |
| 2016/0268745 | A1* | 9/2016 | Little | H01R 13/6273 |
| 2017/0040750 | A1* | 2/2017 | Little | H01R 13/502 |
| 2017/0271823 | A1* | 9/2017 | Zhao | H01R 13/6585 |
| 2018/0151983 | A1* | 5/2018 | Zhao | H01R 13/64 |
| 2019/0148889 | A1* | 5/2019 | Little | H01R 13/6587 |
| | | | | 439/607.05 |
| 2020/0076134 | A1* | 3/2020 | Su | H01R 13/5219 |
| 2020/0287335 | A1* | 9/2020 | Chuang | H01R 12/722 |
| 2021/0066860 | A1* | 3/2021 | Yang | H01R 12/57 |
| 2021/0111508 | A1* | 4/2021 | Gu | H01R 43/24 |
| 2022/0095038 | A1* | 3/2022 | Xie | H04R 5/0335 |
| 2023/0046433 | A1* | 2/2023 | Yen | H01R 24/60 |

FOREIGN PATENT DOCUMENTS

| | | |
|---|---|---|
| TW | M548375 U | 9/2017 |
| TW | 201935774 A | 9/2019 |
| TW | M623906 U | 3/2022 |

* cited by examiner

ELECTRICAL CONNECTOR AND MANUFACTURING METHOD FOR THE SAME

CROSS-REFERENCE TO RELATED APPLICATION

This application claims the priority benefit of Taiwanese Patent Application Serial Number 110130021, filed on Aug. 13, 2021, the full disclosure of which is incorporated herein by reference.

BACKGROUND

Technical Field

The present disclosure relates to the technical field of electrical connector, particularly to a manufacturing method of an electrical connector and the electrical connector that uses a circuit board and an electrical conductor disposed on the circuit board to form electrical connection instead of the conventional rubber core and metal terminals disposed on the rubber core.

Related Art

An electrical connector is a component installed on an electronic device and used to transmit signals between various electronic components of the electronic device or between various electronic devices. Conventional electrical connectors are equipped with an insulated rubber core and a metal terminal disposed on the rubber core. When two corresponding electrical connectors are mutually plugged, the metal terminals of the electrical connectors would be in an overlapped state, so electronic signals can be transmitted between two electrical connectors through an electrical connection configuration of overlapped metal terminals. In this way, electronic signals can be transmitted between the electronic components of the electronic device or between the electronic devices.

The configuration of the insulated rubber core and metal terminal of conventional electrical connector is formed by firstly stamping the metal strip into a metal terminal, then placing the metal terminal in a mold for further plastic injection molding, and simultaneously combined the metal terminal with the insulated rubber core. Such a configuration requires expensive and bulky equipment such as molds and injection molding machines, resulting in high manufacturing cost for the electrical connector and high complexity for the manufacturing process.

SUMMARY

The embodiments of the present disclosure provide an electrical connector and an electrical connector manufacturing method tended to solve the problem of the complex manufacturing process and high manufacturing cost in the prior art by replacing conventional insulated rubber core and metal terminal of electrical connector with a circuit board and an electrical conductor and soldering pads disposed on the circuit board.

One embodiment of the present disclosure provides an electrical connector, which comprises a housing component and a plugging module. One end of the housing component is provided with a mating interface. An accommodating space is provided within the housing component. The accommodating space is communicated with the mating interface. The plugging module is disposed in the accommodating space, comprising: a first circuit board, a plurality of electrical conductors, and a plurality of first soldering pads. The first circuit board is disposed in the accommodating space and comprises a first surface and a second surface opposite to the first surface. The plurality of electrical conductors are disposed on the first surface and/or the second surface and are close to the mating interface. The plurality of first soldering pads are disposed on the second surface and are electrically connected with the electrical conductors.

In another embodiment, the electrical connector further comprises an electrical connecting module. The electrical connecting module is disposed in the accommodating space and is electrically connected with the plugging module, wherein the electrical connecting module comprises a second circuit board, a plurality of second soldering pads, and a plurality of third soldering pads. The second circuit board is disposed in the accommodating space. The second circuit board comprises a third surface and a fourth surface opposite to the third surface. The third surface is close to the second surface of the first circuit board. The plurality of second soldering pads are disposed on the third surface and are soldered to the plurality of first soldering pads. The plurality of third soldering pads are disposed on the fourth surface and are electrically connected with the plurality of third soldering pads.

In another embodiment, the housing component comprises a clamp positioning member and a housing member. The clamp positioning member is combined with an inner wall surface of the housing member to form the accommodating space. The clamp positioning member clamps the first circuit board.

In another embodiment, the clamp positioning member comprises a housing cooperating part and a clamping part. The clamping part is positioned in the housing cooperating part. The clamping part clamps the first circuit board. The housing cooperating part is combined with the inner wall surface of the housing member.

In another embodiment, the clamping part comprises a stopping body and a pair of clamping walls. The stopping body comprises a slot opening, through which the first circuit board passes. The pair of clamping walls are disposed on two opposite sides of the slot opening and respectively abut against the first surface and the second surface of the first circuit board. The stopping body is positioned at the housing cooperating part.

In another embodiment, the first circuit board comprises a pair of stepped parts. The pair of stepped parts are disposed between the first surface and the second surface and abut against the stopping body so that the first circuit board is stopped and positioned at the stopping body.

In another embodiment, the electrical connector further comprises a first sealing material. The first sealing material is disposed on a surface of the stopping body away from the pair of clamping walls and abuts against an inner surface of the housing cooperating part and the first surface and the second surface of the first circuit board.

In another embodiment, the clamping part further comprises a pair of columns disposed on the surface of the stopping body away from the pair of clamping walls.

In another embodiment, the housing cooperating part is sleeve-shaped, one axial end of which forms the mating interface. The housing member is sleeved on an outer peripheral surface of the housing cooperating part and extends from the other axial end of the housing cooperating part in a direction away from the mating interface.

In another embodiment, the electrical connector further comprises a splash-proof sealing member. The splash-proof sealing member is sleeved on the housing cooperating part and close to the mating interface. The housing cooperating part provides a flange on an edge of the mating interface. The splash-proof sealing member abuts against the flange.

In another embodiment, the electrical connector further comprises a second sealing material. The splash-proof sealing member comprises a sealing member body and a plurality of abutting parts. The plurality of abutting parts are connected with the sealing member body and abut against the flange. The second sealing material is disposed between the sealing member body and the flange and abuts against the sealing member body and the flange.

In another embodiment, the sealing member body comprises an annular bump opposite to the flange. The second sealing material is disposed between the annular bump and the flange.

One embodiment of the present disclosure provides a manufacturing method for an electrical connector, comprising: producing a first circuit board; forming a plurality of electrical conductors and a plurality of first soldering pads on the first circuit board by metal materials, wherein the electrical conductors are electrically connected with the first soldering pads; producing a clamp positioning member, which comprises a housing cooperating part and a clamping part, wherein the clamping part is positioned in the housing cooperating part; combining and positioning the first circuit board to the clamping part of the clamp positioning member, wherein the first circuit board is inserted in the housing cooperating part, and the electrical conductors are close to one axial end part of the housing cooperating part; combining a housing member with the housing cooperating part.

In another embodiment, the manufacturing method for the electrical connector further comprises: producing a second circuit board; forming a plurality of second soldering pads and a plurality of third soldering pads on the second circuit board by metal materials, wherein the plurality of second soldering pads are electrically connected with the plurality of third soldering pads; soldering the second soldering pad to the first soldering pad.

In another embodiment, before the step of combining a housing member with the housing cooperating part, a surface of the clamping part is filled with a first sealing material, allowing the first sealing material to close a gap between the clamping part and the first circuit board.

In another embodiment, before the step of combining a housing member with the housing cooperating part, a splash-proof sealing member is firstly produced, then a splash-proof sealing member is sleeved on an outer peripheral surface of the housing cooperating part to close to the axial end part of the housing cooperating part, and finally, a second sealing material is filled between the splash-proof sealing member and the flange of the housing cooperating part.

In the embodiments of the present disclosure, by disposing the circuit board in the housing component and the electrical conductor and the first soldering pad disposed on the circuit board, an electrical connection configuration could be formed with circuit board manufacturing processes. In this way, there is no need to apply metal stamping and buried injection molding as the conventional electrical connector, which requires large sized equipment and high cost manufacturing process to form electrical connection configuration that achieves the same effect as the electrical connector of the prior art. Besides, the first sealing material, the splash-proof sealing member, and the second sealing material could seal the electrical connector of the present disclosure on both inside and outside to prevent moisture infiltration.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

Figure 1:
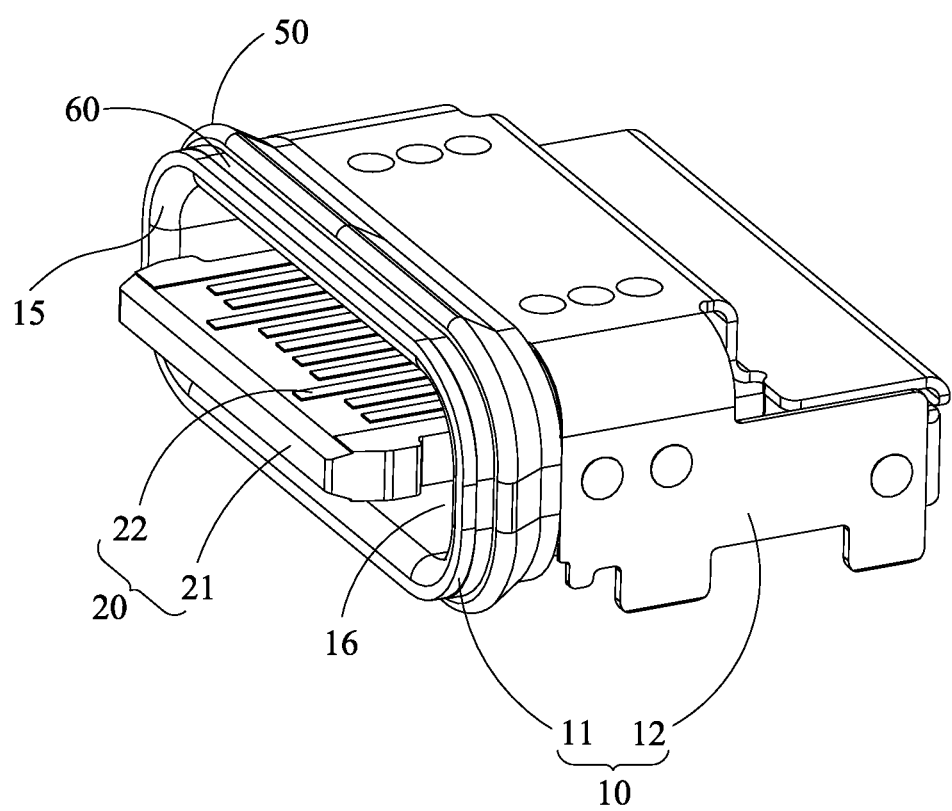
FIG. 1 is a perspective view of an electrical connector of an embodiment of the present disclosure.
Figure 2:
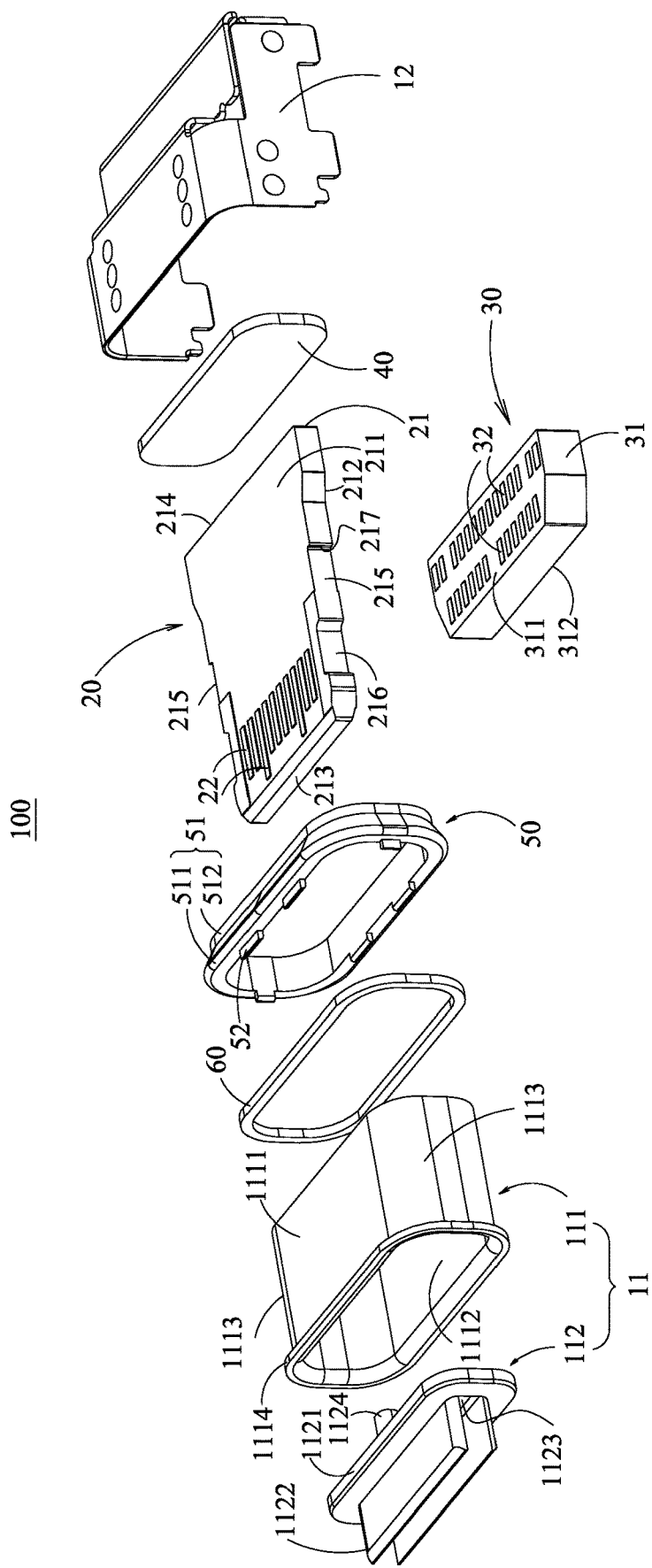
FIG. 2 is an exploded view of the electrical connector of FIG. 1.
Figure 3:
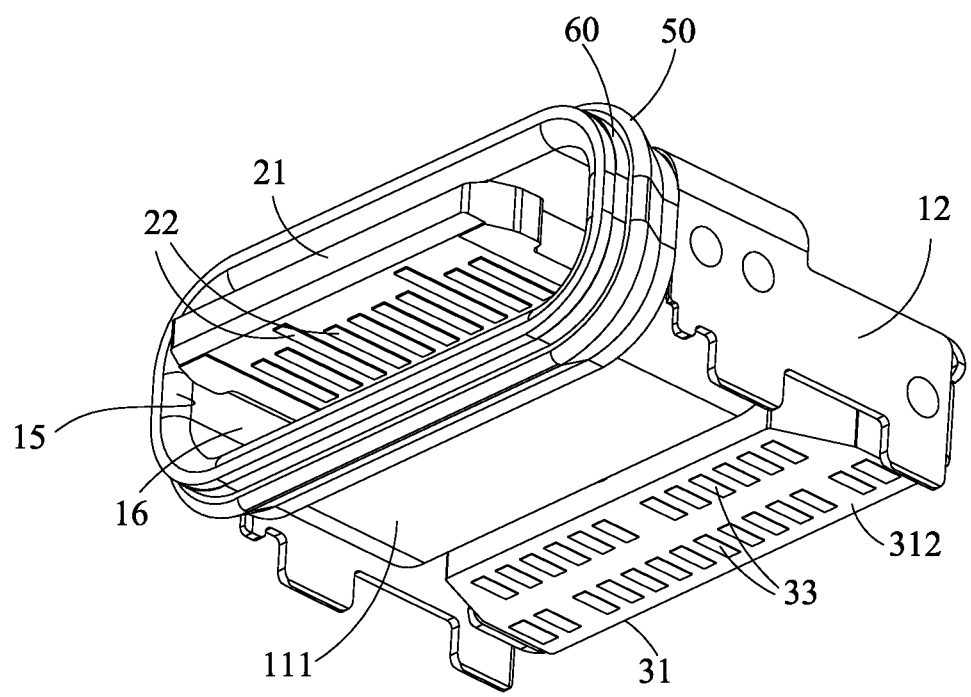
FIG. 3 is another exploded view of the electrical connector of FIG. 1.
Figure 4:
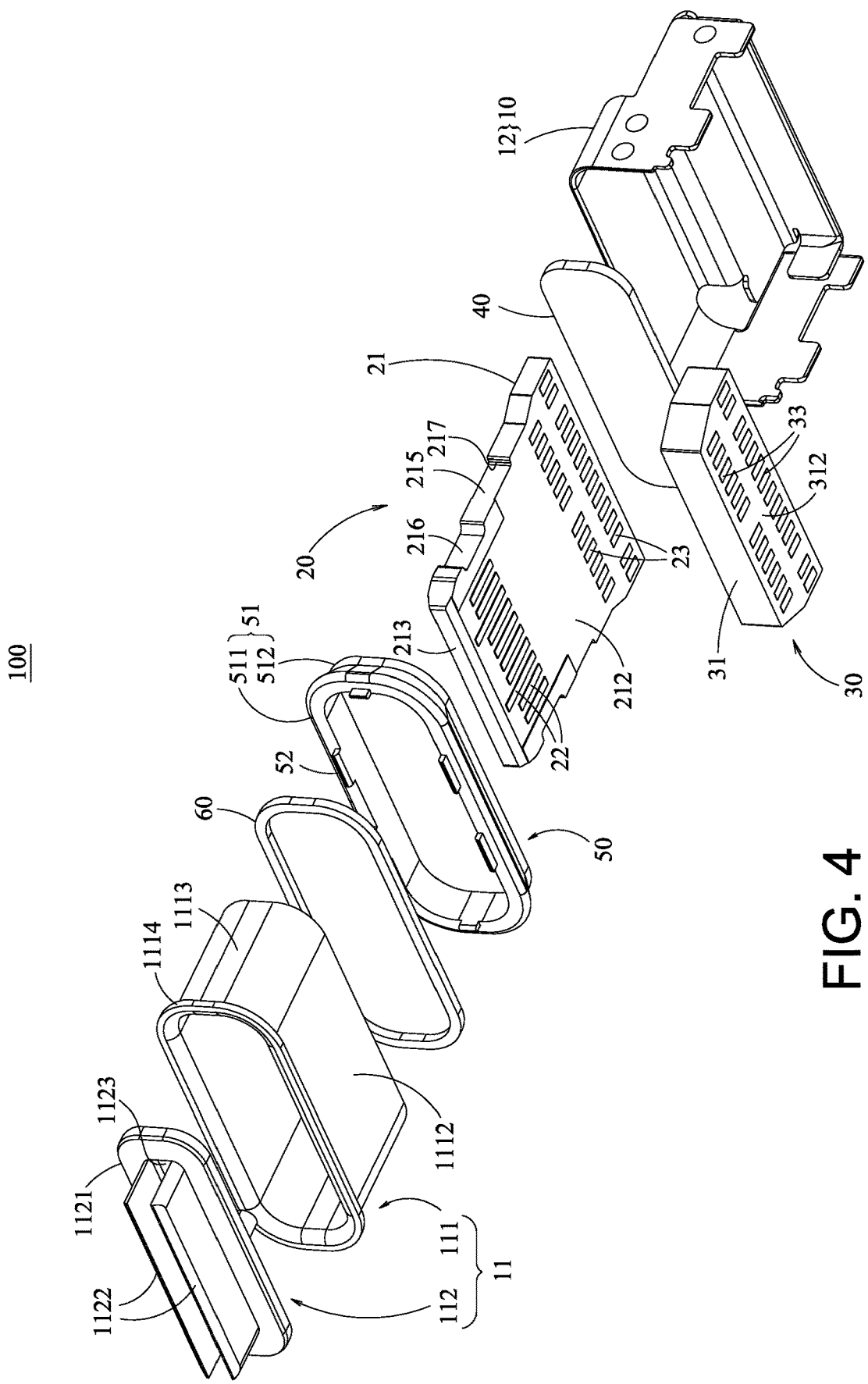
FIG. 4 is an exploded view of the electrical connector of FIG. 3.
Figure 5:
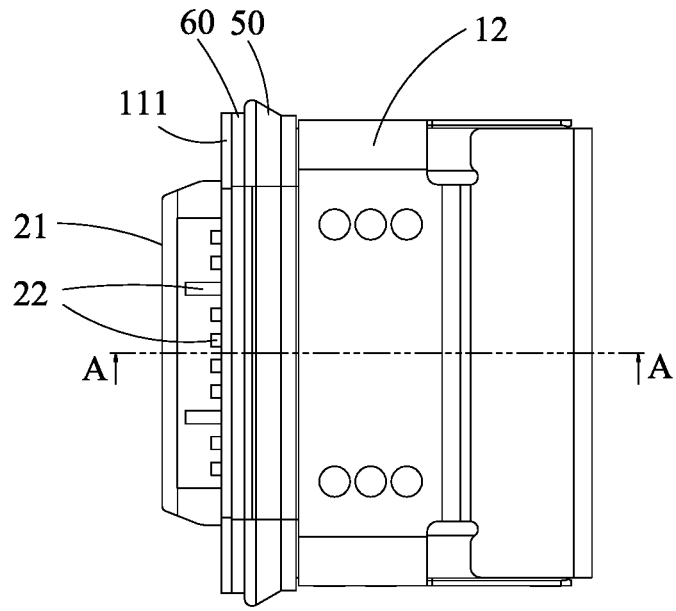
FIG. 5 is a top view of the electrical connector of FIG. 1.
Figure 6:
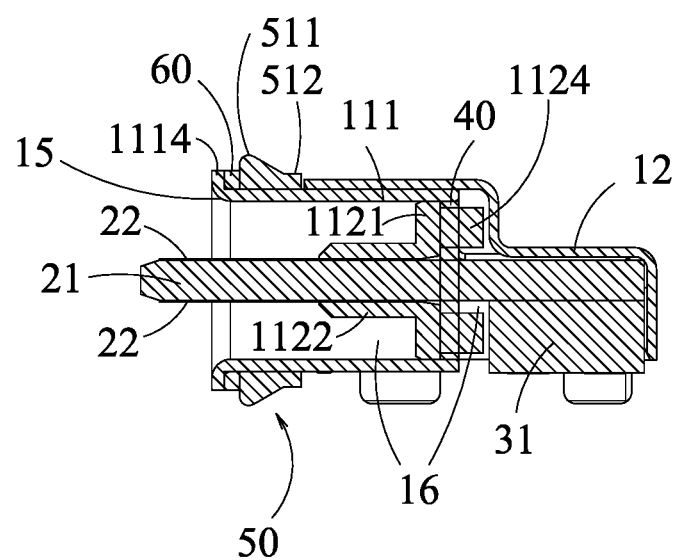
FIG. 6 is a cross-sectional view along line A-A of FIG. 5.

FIG. 1 is a perspective view of an electrical connector of an embodiment of the present disclosure. FIG. 2 and FIG. 3 are exploded views of the electrical connector of FIG. 1. FIG. 4 is an exploded view of the electrical connector of FIG. 3. FIG. 5 is a top view of the electrical connector of FIG. 1. FIG. 6 is a cross-sectional view along line A-A of FIG. 5. These figures present one embodiment of the present disclosure. In this embodiment, a USB type C connector is taken as an example for description, but to which the electrical connector of the present disclosure is not limited, and can be any other type of electrical connector.

In this embodiment, the electrical connector 100 comprises a housing component 10 and a plugging module 20. The plugging module 20 is disposed in the housing component 10 for connecting with a mating connector. The housing component 10 comprises a clamp positioning member 11 and a housing member 12. The clamp positioning member 11 clamps and positions the plugging module 20 to keep the plugging module 20 to be positioned in the housing component 10. The housing member 12 is disposed on the outer peripheral surface of the clamp positioning member 11, that is, the clamp positioning member 11 is combined with an inner wall surface of the housing member 12, so that the clamp positioning member 11 and the housing member 12 form a mating interface 15 and an accommodating space 16 of the housing component 10. The mating interface 15 is communicated with the accommodating space 16, and the mating connector (USB type C connector) can be inserted into the mating interface 15 to enter the accommodating space 16. The accommodating space 16 could accommodate the plugging module 20 and the electrical connection configuration of the mating connector plugged in the plugging module 20.

As shown in FIG. 2 and FIG. 4, The plugging module 20 comprises a first circuit board 21, a plurality of electrical conductors 22, and a plurality of first soldering pads 23. The first circuit board 21 is multi-layered, and blind holes filled with copper and a copper circuit layer could be disposed in the first circuit board 21. The first circuit board 21 comprises a first surface 211 and a second surface 212 opposite to the first surface 211. Four end surfaces are disposed between the first surface 211 and the second surface 212, which are front end surface 213, rear end surface 214, and two side end surfaces 215 having a symmetrical configuration. The front end surface 213 herein refers to a direction facing the mating connector. The two side end surfaces 215 are respectively provided with a mating recess 216 and a stepped part 217. The mating recess 216 can be engaged with the latching member of the mating connector, and the stepped part 217 is abutted against and positioned on the clamp positioning member 11 of the housing component 10.

Since the electrical conductors 22 of this embodiment correspond to the terminals of USB type C, they are disposed on the first surface 211 and the second surface 212 of the first circuit board 21 and are disposed close to the front end surface 213 of the first circuit board 21 to form an overlap with the metal terminal of the mating connector. In corresponding to other types of electrical connectors, such as USB type A connectors, the electrical conductor 22 could also be disposed only on the first surface 211 or only on the second surface 212.

In this embodiment, the first soldering pad 23 is disposed on the second surface 212 of the first circuit board 21 and is disposed on the rear end surface close to the first circuit board 21. The first soldering pad 23 can be soldered to an electrical connecting module 30 described in the following, or it can also be directly soldered to a main circuit board of an electronic device according to the configuration of different types of electrical connectors. In this embodiment, the plurality of first soldering pads 23 are electrically connected with the plurality of electrical conductors 22, respectively, through the blind holes filled with copper and the copper circuit layer of the first circuit board 21. In this embodiment, the first soldering pads 23 are arranged in two rows on the second surface 212 to respectively correspond to the plurality of electrical conductors 22.

The clamp positioning member 11 clamps and positions the first circuit board 21. Since the clamp positioning member 11 is in contact with the first circuit board 21, to avoid problems such as overlap and short circuit, it is made of insulating material, such as plastic material or ceramic. The clamp positioning member 11 comprises a housing cooperating part 111 and a clamping part 112. The clamping part 112 is positioned on an inner wall surface of the housing cooperating part 111 and clamps the first circuit board 21. The housing cooperating part 111 is combined with an inner wall surface of the housing member 12.

In this embodiment, the housing cooperating part 111 is sleeved shaped. The housing cooperating part 111 comprises a top wall 1111 and a bottom wall 1112 opposite to the top wall 1111 and two arc-shaped sidewalls 1113 connected with the top wall 1111 and the bottom wall 1112. An opening of one axial end part of the housing cooperating part 111 forms the aforementioned mating interface 15, and the plugging part of the mating connector can be plugged into the accommodating space 16 through the mating interface 15. The housing member 12 is disposed on the outer peripheral wall of the housing cooperating part 111. In this embodiment, the housing member 12 is formed by bending a metal plate and could cooperate with the shape of the housing cooperating part 111 and accommodate the first circuit board 21 and the second circuit board 31 described in the follows. In this way, the housing cooperating part 111 of the clamp positioning member 11 and the housing member 12 could form an accommodating space 16 to accommodate the first circuit board 21 and the second circuit board 31.

As shown in FIG. 2, FIG. 4, and FIG. 6, the clamping part 112 comprises a stopping body 1121 and a pair of clamping walls 1122. The profile of the stopping body 1121 is identical to the cross section (a section perpendicular to the axial direction) of the housing cooperating part 111. In this way, the stopping body 1121 can be combined with an inner wall surface of the housing cooperating part 111 by a tight fit (interference fit), thereby allowing the clamping part 112 to be combined with the housing cooperating part 111. Alternatively, the housing cooperating part 111 and the clamping part 112 can be integrally formed, such as plastic injection molding or ceramic clay firing.

The stopping body 1121 comprises a slot opening 1123 in the center, through which the first circuit board 21 passes. As described before, the side end surface 215 of the first circuit board 21 comprises a stepped part 217, which is a component in which the width of the first circuit board 21 changes stepwise. Thus, the width of the slot opening 1123 is substantially identical to that of a narrow part of the first circuit board 21 in the stepped part 217 for the first circuit board 21 to pass through. A wider part of the first circuit board 21 in the stepped part 217 is wider than the width of the slot opening 1123, so when the first circuit board 21 passes through the slot opening 1123, the first circuit board 21 would be abutted against and positioned on the stopping body 1121 by allowing the stepped configuration of the stepped part 217 to be abutted against the stopping body 1121.

A pair of clamping walls 1122 are provided on a surface of the stopping body 1121 and are connected with the stopping body 1121 to form an edge of the slot opening 1123. The clamping wall 1122 extends in the direction toward the mating interface 15 of the housing cooperating part 111. When the first circuit board 21 passes through the slot opening 1123 and is positioned at the stepped part 217, the pair of clamping walls 1122 would respectively abut against the first surface 211 and the second surface 212 of the first circuit board 21 to clamp the first circuit board 21. This would not only restricts the movement of the first circuit board 21 along a radial direction of the housing cooperating part 111 but also prevents the first circuit board 21 from sliding along the axial direction of the housing cooperating part 111. The clamping part 112 further comprises a pair of columns 1124 disposed on a surface of the stopping body 1121 away from the pair of clamping walls 1122.

As shown in FIG. 2, FIG. 4, and FIG. 6, in this embodiment, the electrical connector 100 further comprises an electrical connecting module 30. The electrical connecting module 30 comprises a second circuit board 31, a plurality of second soldering pads 32, and a plurality of third soldering pads 33. The second circuit board 31 is disposed on the second surface 212 close to the first circuit board 21 and the rear end surface 214 close to the first circuit board 21. The second circuit board 31 is also multilayered and also comprises blind holes filled with copper and copper circuit layers. The second circuit board 31 comprises a third surface 311 and a fourth surface 312 opposite to the third surface 311. The third surface 311 is facing the second surface 212 of the first circuit board 21, and the fourth surface 312 is facing away from the second surface 212 of the first circuit board 21.

The plurality of second soldering pads 32 are disposed on the third surface 311, and the plurality of third soldering pads 33 are disposed on the fourth surface 312. The plurality of second soldering pads 32 are respectively connected with the plurality of third soldering pads 33 through the blind holes filled with copper and the copper circuit layers. The number of second soldering pads 32 and third soldering pads 33 is the same as the number of first soldering pads 23. The arrangement of the second soldering pads 32 on the third surface 311 corresponds to the arrangement of the first soldering pads 23 on the second surface 212. The arrangement of the third soldering pads 33 on the fourth surface 312 corresponds to the arrangement of the soldering pads on the main circuit board. When the arrangement of the soldering pads on the main circuit board is the same as that of the second soldering pads 32, the third soldering pads 33 would correspond to the second soldering pads 32. When the arrangement of the soldering pads on the main circuit board is different from that of the second soldering pads 32, the arrangement of the third soldering pads 33 would correspond to the arrangement of the soldering pads on the main circuit board.

The plurality of second soldering pads 32 are soldered to the plurality of first soldering pads 23 so that the second circuit board 31 is combined with the first circuit board 21. Through the soldering configuration above, the electrical conductor 22 is electrically connected with the main circuit board through the electrical connection configuration formed by the first soldering pad 23, the second soldering pad 32, the third soldering pad 33, and the soldering pad of the main circuit board. When electronic signals are transmitted from the mating connector to the electrical connector 100 of this embodiment, they would be transmitted to the main circuit board through the electrical connection configuration formed by the electrical conductor 22, the first soldering pad 23, the second soldering pad 32, the third soldering pad 33, and the soldering pad of the main circuit board for complete transmission of electrical signals.

In this embodiment, the electrical connector 100 further comprises a first sealing material 40 which is poured on a surface of the stopping body 1121 away from the clamping wall 1122. That is, the stopping body 1121 is close to a surface of the rear end surface 214 of the first circuit board 21, an edge of the first sealing material 40 could completely abut against and surround the first circuit board 21 to fill the gap between the stopping body 1121 and the first circuit board 21, and the other edge of the first sealing material 40 could also completely abut against and surround the housing cooperating part 111 of the clamp positioning member 11 and could fill the gap between the stopping body 1121 and the housing cooperating part 111, to prevent moisture outside the electrical connector 100 from entering the electronic device through the mating interface 15 and the accommodating space 16 then through the gap between the stopping body 1121 and the first circuit board 21 and the gap between the stopping body 1121 and the housing cooperating part 111. The first sealing material 40 could be a resin, such as epoxy resin, which can be poured on a surface of the stopping body 1121 by a dispensing machine with a dispensing process, and can be filled into the gap between the stopping body 1121 and the first circuit board 21 and the gap between the stopping body 1121 and the housing cooperating part 111 followed by being heated or illuminated to cure.

In this embodiment, the electrical connector 100 further comprises a splash-proof sealing member 50, which is sleeved on an outer peripheral wall of the housing cooperating part 111 of the clamp positioning member 11. In this embodiment, the housing cooperating part 111 further comprises a flange 1114 at the mating interface 15. The flange 1114 extends radially and surrounds the top wall 1111, the bottom wall 1112, and the two sidewalls 1113. The splash-proof sealing member 50 comprises a sealing member body 51 and a plurality of abutting parts 52. The abutting parts 52 are connected with the sealing member body 51 and extend axially from an edge of the sealing member body 51. The sealing member body 51 comprises an annular bump 511 and a sleeve engaging part 512. The annular bump 511 protrudes radially from the sleeve engaging part 512 and is disposed opposite to the flange 1114 of the housing cooperating part 111. The sleeve engaging part 512 is sleeved on the outer peripheral wall of the housing cooperating part 111. The sealing member body 51 is sleeved on the outer peripheral wall of the housing cooperating part 111, and the abutting part 52 abuts against the flange 1114 of the housing cooperating part 111. The splash-proof sealing member 50 can be made of rubber or resin.

In this embodiment, the electrical connector 100 further comprises a second sealing material 60 which is filled in the gap between the sealing member body 51 and the flange 1114 of the housing cooperating part 111 by dispensing. The second sealing material 60 can be made of resin, such as epoxy resin, which can be cured by heating or light.

The splash-proof sealing member 50 and the second sealing material 60 can seal the gap between the electronic device and the electrical connector 100 to prevent moisture from entering the electronic device through the gap between the electronic device and the electrical connector 100.

Figure 7:
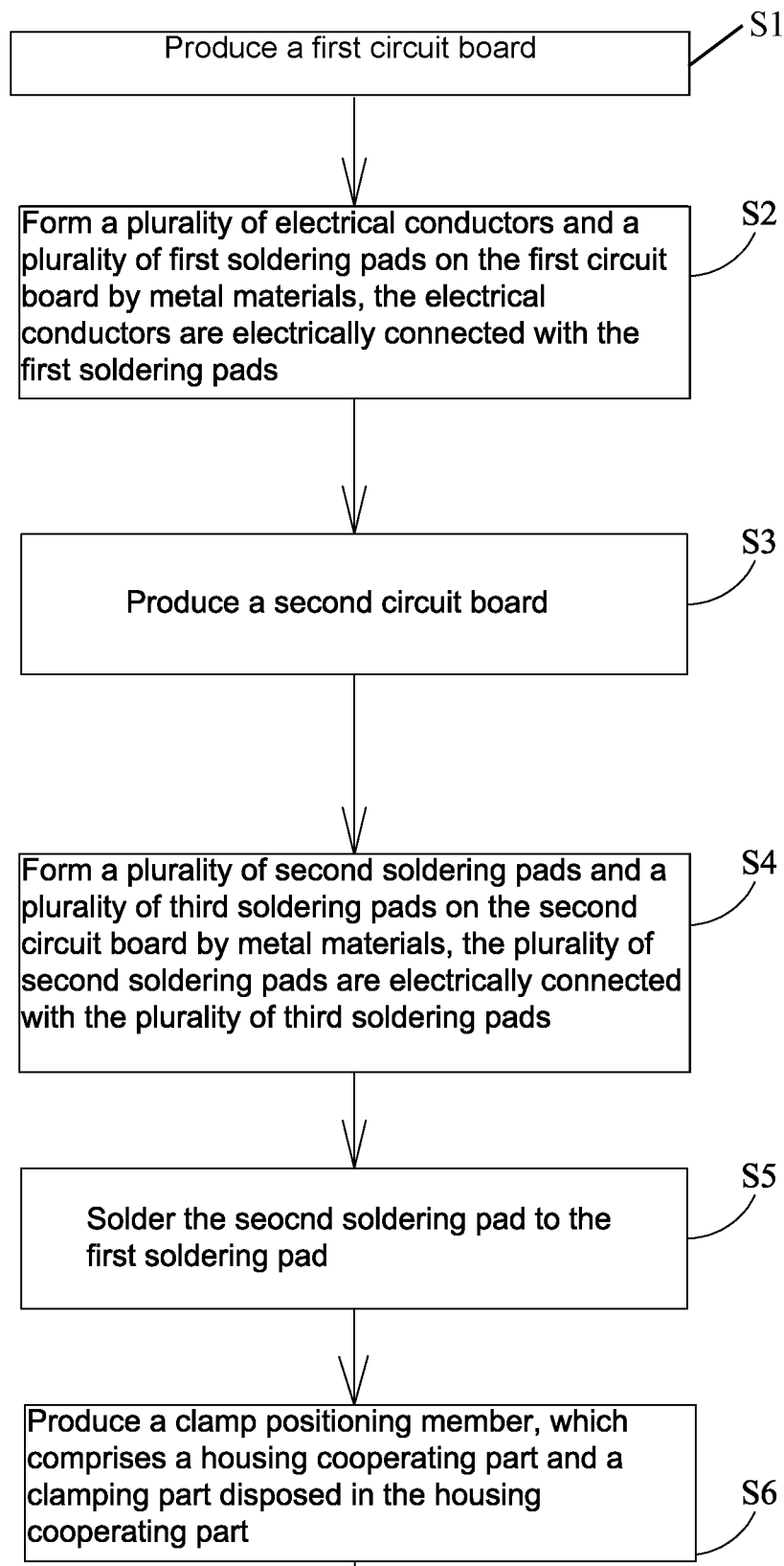
FIG. 7 and FIG. 8 are flowcharts of a manufacturing method for an electrical connector of an embodiment of the present disclosure.
Figure 8:
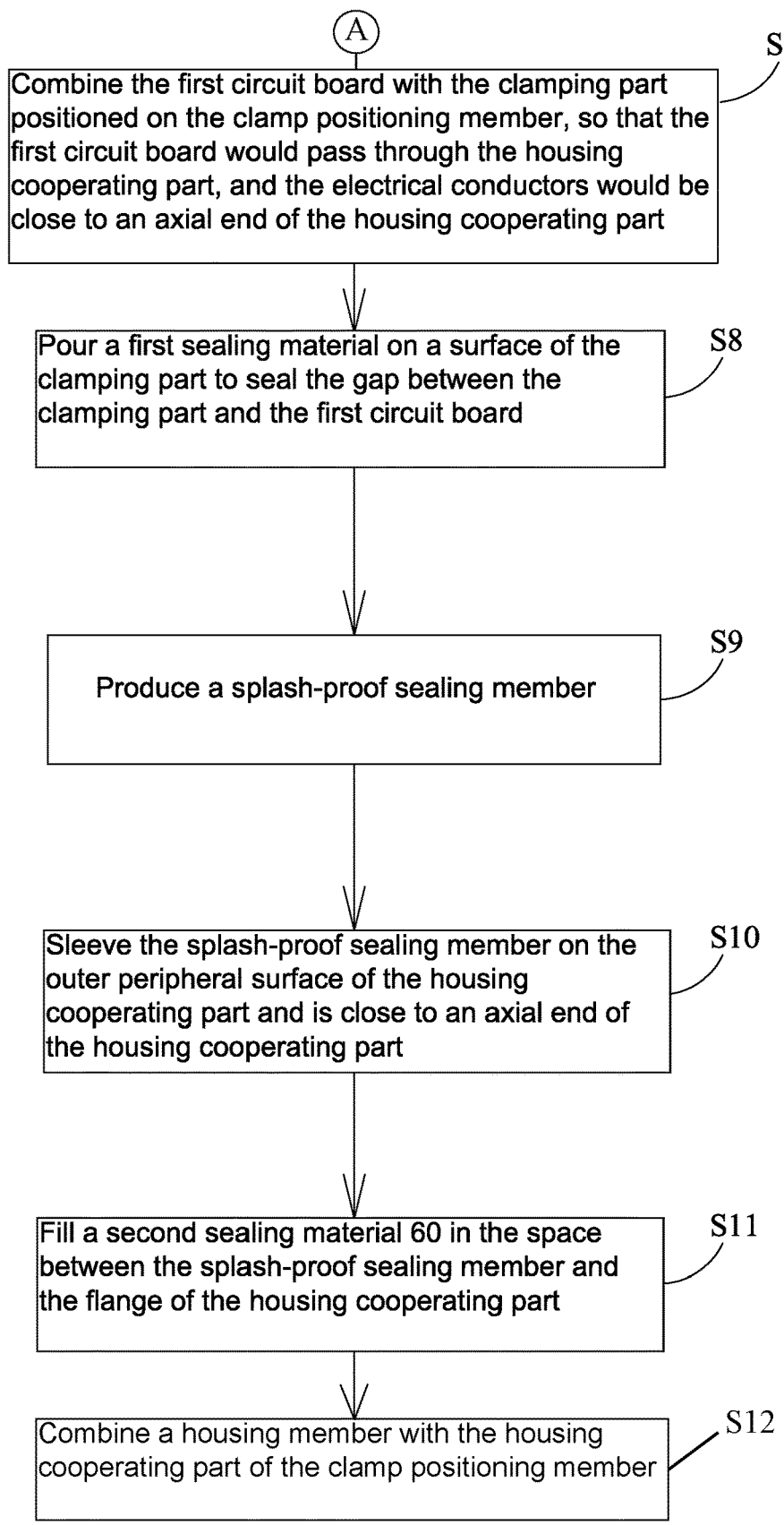

FIG. 7 and FIG. 8 are flowcharts of a manufacturing method for an electrical connector of an embodiment of the present disclosure. FIG. 9 to FIG. 15 are schematic diagrams showing the manufacturing process of the electrical connector corresponding to the manufacturing method shown in FIG. 7 and FIG. 8. As shown in the figures, the electrical connector manufacturing method of this embodiment comprises multiple steps.

In step S1, a first circuit board 21 is fabricated, which is a multilayered component, comprising a blind hole filled with copper and a copper circuit layer performing electrical connection. Then go to step S2.

In step S2, a plurality of electrical conductors 22 and a plurality of first soldering pads 23 are formed on the first circuit board 21 by metal materials. The electrical conductors 22 and the first soldering pads 23 can be formed on the first surface 211 and the second surface 212 of the first circuit board 21 by electroplating. The electrical conductors 22 are electrically connected with the first soldering pads 23 by the aforementioned electrical connection configuration of the first circuit board 21. Then go to step S3.

In step S3, a second circuit board 31 is fabricated, which is a multilayered component, comprising a blind hole filled with copper and a copper circuit layer performing electrical connection. Then go to step S4.

In step S4, a plurality of second soldering pads 32 and a plurality of third soldering pads 33 are formed on the second circuit board 31 by metal materials. The second soldering pads 32 and the third soldering pads 33 can be formed on the second circuit board 31 by electroplating. The electrical conductors 22 are electrically connected with the third soldering pads 33 by the aforementioned electrical connection configuration. Then go to step S5.

Figure 9:
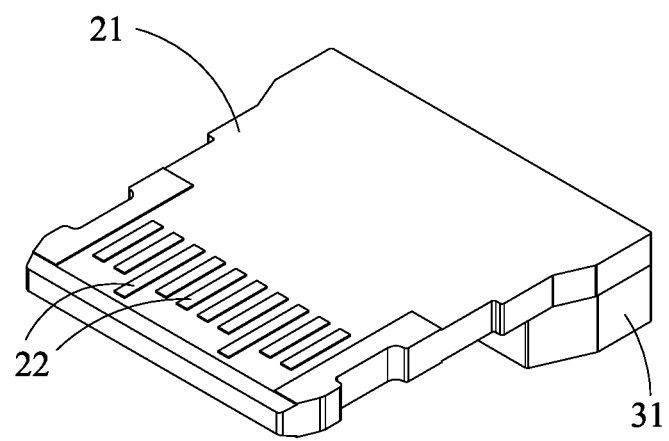
FIG. 9 is a perspective view showing the assembly of a first circuit board and a second circuit board of the electrical connector of FIG. 1.

Referring to FIG. 9, in step S5, the second soldering pad 32 is soldered to the first soldering pad 23, so that the second circuit board 31 would be connected with the first circuit board 21. Then go to step S6. For the electrical connector without the second circuit board 31, proceed directly from step S2 to step S6.

In step S6, a clamp positioning member 11 is produced, which comprises a housing cooperating part 111 and a clamping part 112 disposed in the housing cooperating part 111. The housing cooperating part 111 and the clamping part 112 are made of insulating material, such as plastic or ceramic, which can be individually manufactured and then the clamping part 112 can be coupled to an inner wall surface of the housing cooperating part 111 in a tight-fitting manner. The housing cooperating part 111 and the clamping part 112 can also be integrally manufactured, such as plastic injection molding. Then go to step S7.

Figure 10:
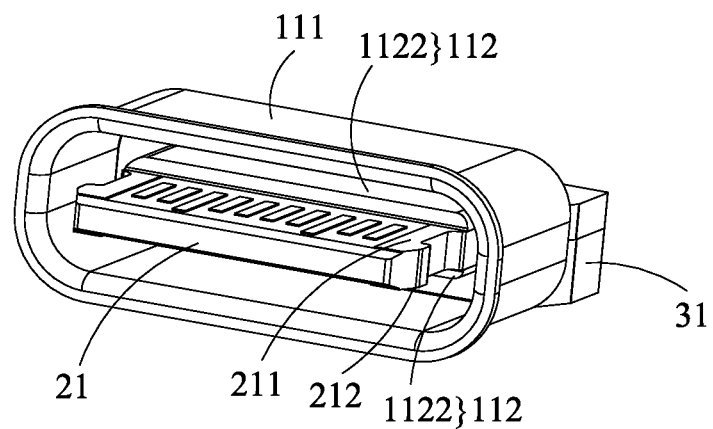
FIG. 10 is a perspective view showing the assembly of a clamp positioning member and the second circuit board of the electrical connector of FIG. 1.
Figure 11:
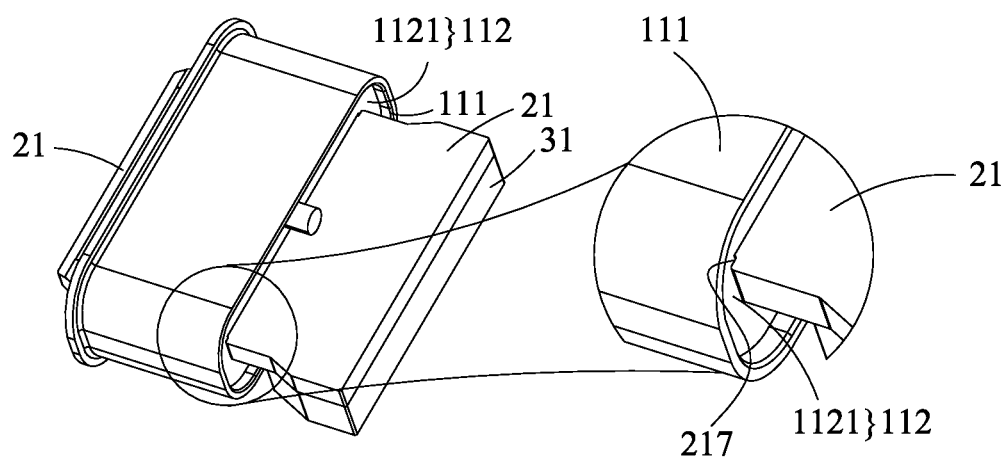
FIG. 11 is another exploded view of the electrical connector of FIG. 10.

Referring to FIG. 10 and FIG. 11, in step S7, the first circuit board 21 is combined with the clamping part 112 positioned on the clamp positioning member 11, so that the first circuit board 21 would pass through the housing cooperating part 111, and the electrical conductors 22 would be close to an axial end of the housing cooperating part 111 (mating interface 15). The clamping part 112 comprises a stopping body 1121 and a pair of clamping walls 1122. The first circuit board 21 passes all the way through a slot opening 1123 of the stopping body 1121 to a stepped part 217 of the first circuit board 21 and abuts against the stopping body 1121. The clamping wall 1122 clamps the first circuit board 21 to prevent the first circuit board 21 from sliding along the axial direction. Then go to step S8.

Figure 12:
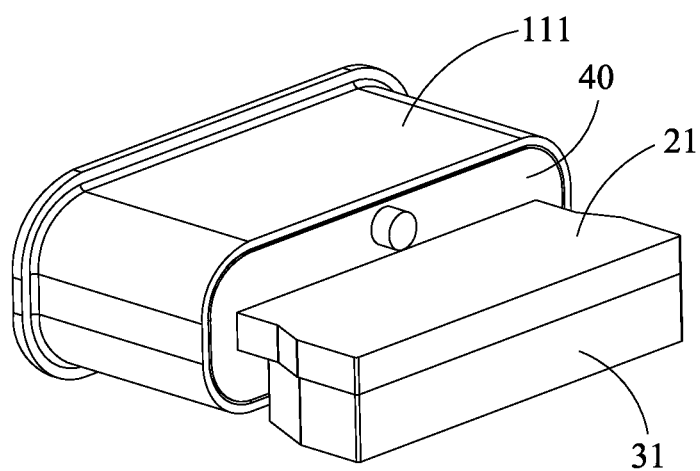
FIG. 12 is a perspective view showing the first sealing material filled in the clamp positioning member and the first circuit board of the electrical connector of FIG. 10.

Referring to FIG. 12, in step S8, a first sealing material 40 is poured on a surface of the clamping part 112, and also seals the gap between the clamping part 112 and the first circuit board 21 and the gap between the clamping part 112 and the housing cooperating part 111. The first sealing material 40, such as resin, is poured on the surface of the clamping part 112 and filled in the space between the clamping part 112 and the housing cooperating part 111 by dispensing with a dispenser. Then the sealing material is cured by heating or light. Then go to step S9.

In step S9, a splash-proof sealing member 50 is produced. The splash-proof sealing member 50 is made of rubber or resin, which comprises a sealing member body 51 and a plurality of abutting parts 52. The abutting part 52 is connected with the sealing member body 51 and axially extends from an edge of the sealing member body 51. Then go to step S10.

Figure 13:
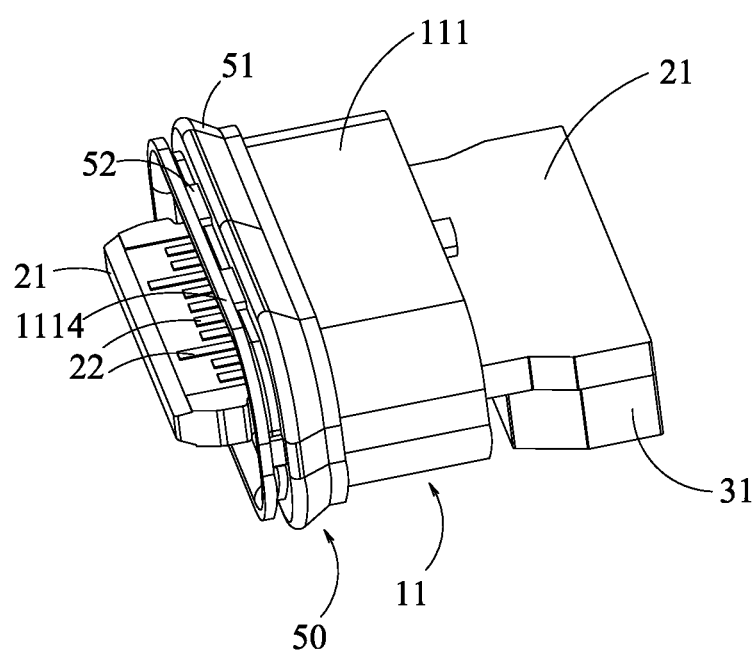
FIG. 13 is a perspective view showing a splash-proof sealing member assembled to the clamp positioning member of the electrical connector of FIG. 12.

Referring to FIG. 13, in step S10, the splash-proof sealing member 50 is sleeved on the outer peripheral surface of the housing cooperating part 111 and is close to an axial end of the housing cooperating part 111 (mating interface 15). The abutting part 52 of the splash-proof sealing member 50 abuts against a flange 1114 of the housing cooperating part 111. Then go to step S11.

Figure 14:
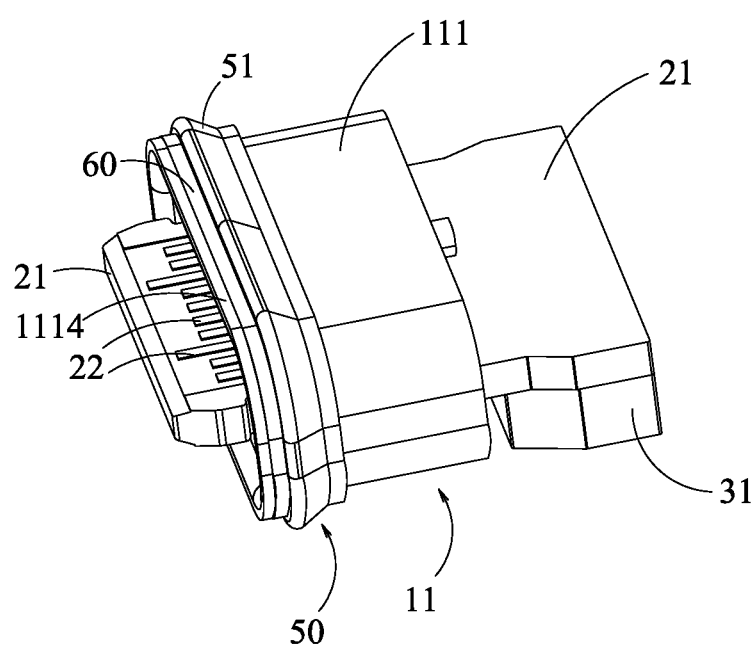
FIG. 14 is a perspective view showing the second sealing material filled between the splash-proof sealing member and the clamp positioning member of the electrical connector of FIG. 13.

Referring to FIG. 14, in step S11, a second sealing material 60 is filled in the space between the splash-proof sealing member 50 and the flange 1114 of the housing cooperating part 111. The second sealing material 60, such as resin, is poured into the flange 1114 of the housing cooperating part 111 by dispensing with a dispenser, and then the sealing material is cured by heating or light. Then go to step S12. For the electrical connector of another embodiment without the first sealing material 40, the splash-proof sealing member 50, and the second sealing material 60, go directly from step S7 to step S12.

Figure 15:
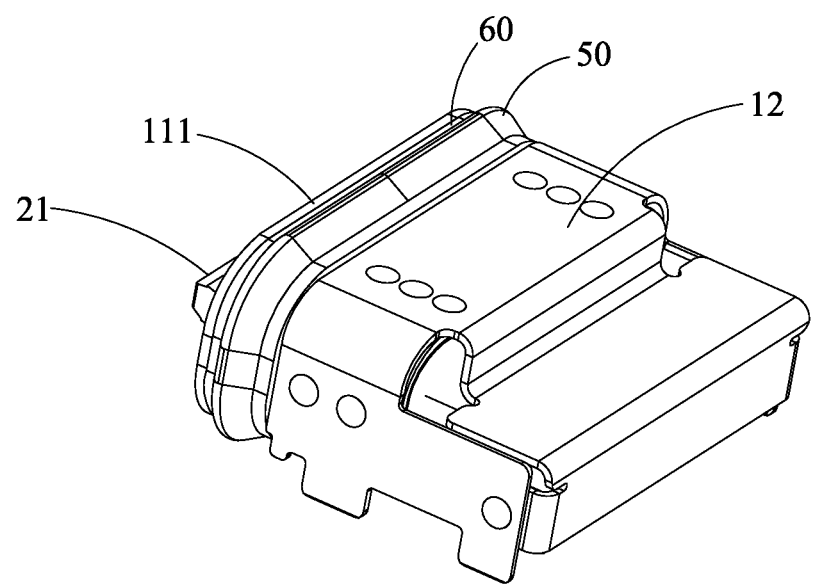
FIG. 15 is a perspective view showing the housing member assembled to the clamp positioning member, the first circuit board, and the second circuit board of the electrical connector of FIG. 14.

Referring to FIG. 15, in step S12, a housing member 12 is combined with the housing cooperating part 111 of the clamp positioning member 11. A piece of metal material can be bent according to the shape of the housing cooperating part 111, and then be further bent according to the structural configuration of the first circuit board 21 stacked with the second circuit board 31 to form the housing member 12.

In the embodiments of the present disclosure, by disposing the circuit board in the housing component and the electrical conductor and the first soldering pad disposed on the circuit board, an electrical connection configuration could be formed with circuit board manufacturing processes. In this way, there is no need to apply metal stamping and buried injection molding as the conventional electrical connector, which requires large sized equipment and high cost manufacturing process to form electrical connection configuration that achieves the same effect as the electrical connector of the prior art. Besides, the first sealing material, the splash-proof sealing member, and the second sealing material could seal the electrical connector of the present disclosure on both inside and outside to prevent moisture infiltration.

It is to be understood that the term "comprises", "comprising", or any other variants thereof, is intended to encompass a non-exclusive inclusion, such that a process, method, article, or device of a series of elements not only comprise those elements but further comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. An electrical connector, comprising:
   a housing component, one end of the which being provided with a mating interface, an accommodating space being provided within the housing component, the accommodating space being communicated with the mating interface; and
   a plugging module disposed in the accommodating space, comprising:
     a first circuit board disposed in the accommodating space and comprising a first surface and a second surface opposite to the first surface;
     a plurality of electrical conductors disposed on the first surface and/or the second surface and being close to the mating interface; and
     a plurality of first soldering pads disposed on the second surface and being electrically connected with the electrical conductors;
   wherein the housing component comprises a clamp positioning member and a housing member; the clamp positioning member is combined with an inner wall surface of the housing member to form the accommodating space; the clamp positioning member clamps the first circuit board;
   wherein the clamp positioning member comprises a housing cooperating part and a clamping part; the clamping part is positioned in the housing cooperating part; the clamping part clamps the first circuit board; the housing cooperating part is combined with the inner wall surface of the housing member;
   wherein the clamping part comprises a stopping body and a pair of clamping walls; the stopping body comprises a slot opening, through which the first circuit board passes; the pair of clamping walls are disposed on two opposite sides of the slot opening and respectively abut against the first surface and the second surface of the first circuit board; the stopping body is positioned at the housing cooperating part.

2. The electrical connector according to claim 1 comprising an electrical connecting module, the electrical connecting module being disposed in the accommodating space and being electrically connected with the plugging module, wherein the electrical connecting module comprises:
   a second circuit board disposed in the accommodating space; the second circuit board comprises a third surface and a fourth surface opposite to the third surface; the third surface is close to the second surface of the first circuit board;
   a plurality of second soldering pads disposed on the third surface and are soldered to the plurality of first soldering pads; and
   a plurality of third soldering pads disposed on the fourth surface and are electrically connected with the plurality of third soldering pads.

3. The electrical connector according to claim 1, wherein the first circuit board comprises a pair of stepped parts; the pair of stepped parts are disposed between the first surface and the second surface and abut against the stopping body so that the first circuit board is stopped and positioned at the stopping body.

4. The electrical connector according to claim 1 comprising a first sealing material, the first sealing material being disposed on a surface of the stopping body away from the pair of clamping walls and abutting against an inner surface of the housing cooperating part and the first surface and the second surface of the first circuit board.

5. The electrical connector according to claim 1, wherein the clamping part further comprises a pair of columns disposed on the surface of the stopping body away from the pair of clamping walls.

6. The electrical connector according to claim 1, wherein the housing cooperating part is sleeve-shaped, one axial end of which forms the mating interface; the housing member is sleeved on an outer peripheral surface of the housing cooperating part and extends from the other axial end of the housing cooperating part in a direction away from the mating interface.

7. The electrical connector according to claim 6 comprising a splash-proof sealing member, the splash-proof sealing member being sleeved on the housing cooperating part and close to the mating interface, the housing cooperating part providing a flange on an edge of the mating interface, the splash-proof sealing member abutting against the flange.

8. The electrical connector according to claim 7 comprising a second sealing material, the splash-proof sealing member comprising a sealing member body and a plurality of abutting parts, the plurality of abutting parts being connected with the sealing member body and abutting against the flange, the second sealing material being disposed between the sealing member body and the flange and abutting against the sealing member body and the flange.

9. The electrical connector according to claim 8, wherein the sealing member body comprises an annular bump opposite to the flange; the second sealing material is disposed between the annular bump and the flange.

10. A manufacturing method for an electrical connector, comprising:
    producing a first circuit board;
    forming a plurality of electrical conductors and a plurality of first soldering pads on the first circuit board by metal materials, the electrical conductors being electrically connected with the first soldering pads;

producing a clamp positioning member, which comprising a housing cooperating part and a clamping part, the clamping part being positioned in the housing cooperating part;

combining and positioning the first circuit board to the clamping part of the clamp positioning member, the first circuit board being inserted in the housing cooperating part, the electrical conductors being close to one axial end part of the housing cooperating part; and combining a housing member with the housing cooperating part;

wherein the clamp positioning member is combined with an inner wall surface of the housing member to form an accommodating space; the clamp positioning member clamps the first circuit board;

wherein the clamping part clamps the first circuit board; the housing cooperating part is combined with the inner wall surface of the housing member;

wherein the clamping part comprises a stopping body and a pair of clamping walls; the stopping body comprises a slot opening, through which the first circuit board passes; the pair of clamping walls are disposed on two opposite sides of the slot opening and respectively abut against a first surface and a second surface of the first circuit board; the stopping body is positioned at the housing cooperating part.

11. The manufacturing method for an electrical connector according to claim 10, comprising:

producing a second circuit board;

forming a plurality of second soldering pads and a plurality of third soldering pads on the second circuit board by metal materials, the plurality of second soldering pads being electrically connected with the plurality of third soldering pads; and soldering the second soldering pad to the first soldering pad.

12. The manufacturing method for an electrical connector according to claim 10, wherein before the step of combining a housing member with the housing cooperating part:

a surface of the clamping part is filled with a first sealing material, allowing the first sealing material to close a gap between the clamping part and the first circuit board.

13. The manufacturing method for an electrical connector according to claim 11, wherein before the step of combining a housing member with the housing cooperating part:

a surface of the clamping part is filled with a first sealing material, allowing the first sealing material to close a gap between the clamping part and the first circuit board.

14. The manufacturing method for an electrical connector according to claim 10, wherein before the step of combining a housing member with the housing cooperating part:

a splash-proof sealing member is produced;

a splash-proof sealing member is sleeved on an outer peripheral surface of the housing cooperating part to close to the axial end part of the housing cooperating part; and a second sealing material is filled between the splash-proof sealing member and the flange of the housing cooperating part.

15. The manufacturing method for an electrical connector according to claim 11, wherein before the step of combining a housing member with the housing cooperating part:

a splash-proof sealing member is produced;

a splash-proof sealing member is sleeved on an outer peripheral surface of the housing cooperating part to close to the axial end part of the housing cooperating part; and a second sealing material is filled between the splash-proof sealing member and the flange of the housing cooperating part.

* * * * *